United States Patent
Sultan et al.

(10) Patent No.: US 6,979,635 B1
(45) Date of Patent: Dec. 27, 2005

(54) METHOD OF FORMING MINIATURIZED POLYCRYSTALLINE SILICON GATE ELECTRODES USING SELECTIVE OXIDATION

(75) Inventors: Akif Sultan, Austin, TX (US); Qi Xiang, San Jose, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/759,171

(22) Filed: Jan. 20, 2004

(51) Int. Cl.[7] ......................................... H01L 21/3205
(52) U.S. Cl. ...................... 438/595; 438/770; 438/976
(58) Field of Search ................................ 438/149, 151, 438/163, 164, 197, 217, 229–232, 289, 585, 438/595, 976, 265, 466

(56) References Cited

U.S. PATENT DOCUMENTS

| | | | | |
|---|---|---|---|---|
| 5,476,802 A | * | 12/1995 | Yamazaki et al. | 438/307 |
| 5,937,319 A | * | 8/1999 | Xiang et al. | 438/585 |
| 6,509,275 B1 | * | 1/2003 | Kamijima | 438/704 |
| 6,521,500 B1 | * | 2/2003 | Goto | 438/299 |

OTHER PUBLICATIONS

Stanley Wolf and Richard N. Tauber, Silicon Processing For The VLSI Era, 1986, Lattice Press, vol. 1, pp. 191-194.*

* cited by examiner

*Primary Examiner*—Lynne A. Gurley
*Assistant Examiner*—Stanetta Isaac

(57) ABSTRACT

Ultra narrow and thin polycrystalline silicon gate electrodes are formed by patterning a polysilicon gate precursor, reducing its width and height by selectively oxidizing its upper and side surfaces, and then removing the oxidized surfaces. Embodiments include patterning the polysilicon gate precursor with an oxide layer thereunder, ion implanting to form deep source/drain regions, forming a nitride layer on the substrate surface on each side of the polysilicon gate precursor, thermally oxidizing the upper and side surfaces of the polysilicon gate precursor thereby consuming silicon, and then removing the oxidized upper and side surfaces leaving a polysilicon gate electrode with a reduced width and a reduced height. Subsequent processing includes forming shallow source/drain extensions, forming dielectric sidewall spacers on the polysilicon gate electrode and then forming metal silicide layers on the upper surface of the polysilicon gate electrode and over the source/drain regions.

14 Claims, 8 Drawing Sheets

METHOD OF FORMING MINIATURIZED POLYCRYSTALLINE SILICON GATE ELECTRODES USING SELECTIVE OXIDATION

TECHNICAL FIELD

The present invention relates to the fabrication of miniaturized semiconductor devices comprising transistors with a gate electrode having a significantly reduced height and width. The present invention is particularly applicable to ultra large scale integrated circuit systems having features in the deep sub-micron regime.

BACKGROUND ART

As the drive for faster miniaturized semiconductor devices proceeds apace, it becomes increasingly more difficult to fabricate device features without engendering disadvantages. It is particularly challenging to form gate electrodes having a reduced height and a reduced width, such as a height less than 1,000 Å and a width less than 500 Å, without creating various issues. For example, it is extremely difficult to pattern a gate electrode having a width less than 500 Å by conventional photolithographic techniques with any degree of precision and reproducibility. Moreover, as the gate width decreases, the aspect ratio of the gate electrode disadvantageously increases. However, the gate electrode must be sufficient high to prevent impurity ion penetration therethrough into the underlying gate dielectric layer with an attendant decrease in reliability, as during ion implantation to form deep source/drain regions. Moreover, a high gate height contributes to fringing capacitance between the gate electrode and associated source/drain regions.

Accordingly, a need exists for methodology enabling the fabrication of semiconductor devices comprising transistors having a gate electrode with a reduced width and also a reduced height. There exists a particular need for methodology enabling the fabrication of semiconductor devices comprising transistors with a gate electrode having a width less than 500 Å and a height less than 1,000 Å.

DISCLOSURE OF THE INVENTION

An advantage of the present invention is a method of manufacturing a semiconductor device comprising a transistor having a miniaturized gate electrode with reduced fringing capacitance.

Another advantage of the present invention is a method of fabricating a semiconductor device comprising a transistor having an accurately dimensioned gate electrode with a height less than 1,000 Å and a width less than 500 Å, without adversely impacting gate dielectric integrity and transistor reliability while preserving the advantageous device performance associated with deep source/drain implants required for good contacts.

Another advantage of the present invention is a method of fabricating a semiconductor device comprising transistors having a gate electrode width less than 500 Å and a height less than 1,000 Å with significantly less demanding photolithographic capabilities which would otherwise be required for such small gates.

Additional advantages and other features of the present invention will be set forth in the description which follows, and in part will become apparent to those having ordinary skill in the art upon examination of the following or may be learned by practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a polysilicon gate electrode precursor having first side surfaces at a first width and a first upper surface at a first height, over a main surface of the semiconductor substrate with a gate insulating layer therebetween; selectively oxidizing the first side surfaces and first upper surface of the polysilicon gate electrode precursor to form oxidized layers thereon; and removing the oxidized layers from the polysilicon gate electrode precursor to form a polysilicon gate electrode having second side surfaces at a second width less than the first width and a second upper surface at a second height less than the first height.

Embodiments of the present invention comprise ion implanting impurities, using the polysilicon gate electrode precursor as a mask, to form deep source/drain regions; forming nitride layers on the main surface of the semiconductor substrate over the deep source/drain layers on opposite sides of the polysilicon gate electrode precursor; selectively oxidizing the first side surfaces and first upper surface of the polysilicon gate electrode precursor to form the oxidized layers thereon, removing the oxidized layers from the polysilicon gate electrode precursor to form the polysilicon gate electrode, removing the nitride layers, and ion implanting impurities, using the polysilicon gate electrode as a mask, to form source/drain extensions. Embodiments of the present invention further include forming dielectric sidewall spacers on the second side surfaces of the polysilicon gate electrode and forming metal silicide layers on the second upper surface of the polysilicon gate electrode and on the main surface of the semiconductor substrate over the deep source/drain regions. Embodiments of the present invention enable formation of polysilicon gate electrodes having a height less than 1,000 Å, such as 300 Å to 900 Å, and a width less than 500 Å, such as 150 Å to 400 Å.

Additional advantages of the present invention will become readily apparent to those having ordinary skill in the art from the following detailed description, wherein embodiments of the present invention are described simply by way of illustration of the best mode contemplated for carrying out the present invention. As will be realized, the present invention is capable of other and different embodiments, and its several details are capable of modifications in various obvious respects all without departing from the present invention. Accordingly, the drawings and description are to be regarded as illustrative in nature, and not as restrictive.

DESCRIPTION OF THE INVENTION

The present invention addresses and solves problems attendant upon fabricating miniaturized semiconductor devices, particularly transistors having a miniaturized gate electrode, such as a gate electrode with a height less than 1,000 Å and a width less than 500 Å. Conventional photolithographic techniques are limited in their ability resolution capabilities and, hence, cannot be used to pattern gate electrodes with a width less than 500 Å with the requisite precision and reproducibility. Reduction of the gate width disadvantageously increases the aspect ratio of the gate electrode. However, the gate electrode must be sufficiently high to prevent implanted impurities from penetrating therethrough into the underlying gate oxide layer with attendant degradation thereof, as during ion implantation to form deep source/drain regions.

The present invention addresses and solves such problems by forming a gate electrode precursor having a first width fully within the resolution capability of conventional photolithographic techniques and at a first height sufficient to prevent impurity ion penetration therethrough into the underlying gate dielectric layer. In accordance with the present invention, the side surfaces and upper surface of the originally formed gate electrode precursor are selectively oxidized, thereby consuming silicon from the side surfaces and upper surface of the gate electrode precursor. Subsequently, the oxidized layers are removed from the side surfaces and upper surface of the gate electrode precursor leaving the finally dimensioned gate electrode having a reduced height and reduced width.

Figure 1:
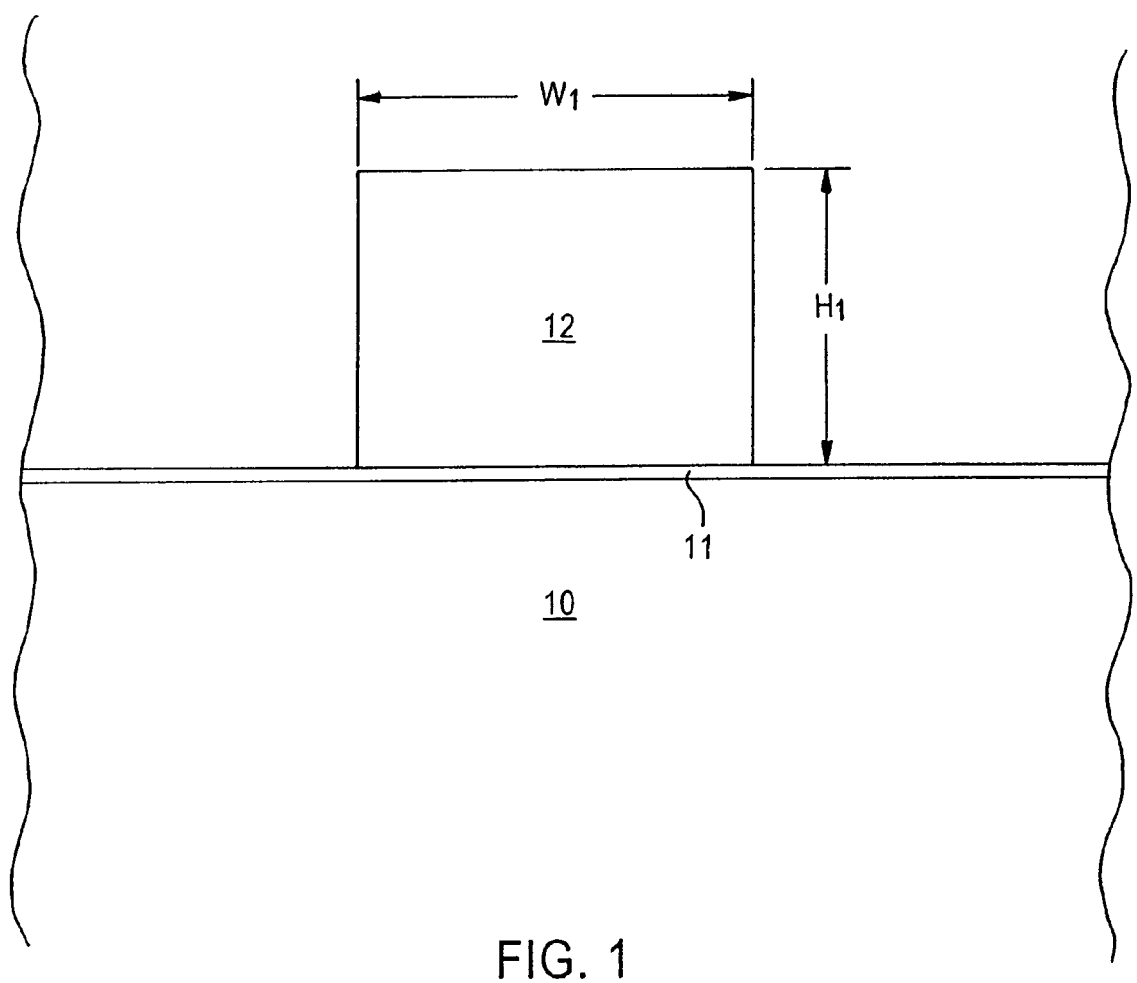
FIGS. 1 through 8 schematically illustrate sequential phases of a method in accordance with an embodiment of the present invention, wherein like features or elements are denoted by like reference numerals.

An embodiment of the present invention is schematically illustrated in FIGS. 1 through 8, adverting to FIG. 1, an oxide layer 11 is formed over a main surface of the semiconductor substrate 10. A polycrystalline silicon layer is deposited and patterned in a conventional manner employing conventional photolithographic techniques to yield a polysilicon gate precursor 12 having a width fully within the resolution capabilities of conventional photolithographic techniques. For example, the polysilicon gate precursor 12 may have a height (H1) greater than 1,000 Å, such as 1,000 Å to 1,500 Å, and a width (W1) greater than 500 Å, e.g., 500 Å to 800 Å. During patterning, the gate oxide layer 11 may optionally remain on the main surface of the semiconductor substrate 10 on opposite sides thereof of gate electrode precursor 12 or may be removed during gate electrode precursor patterning.

Figure 2:
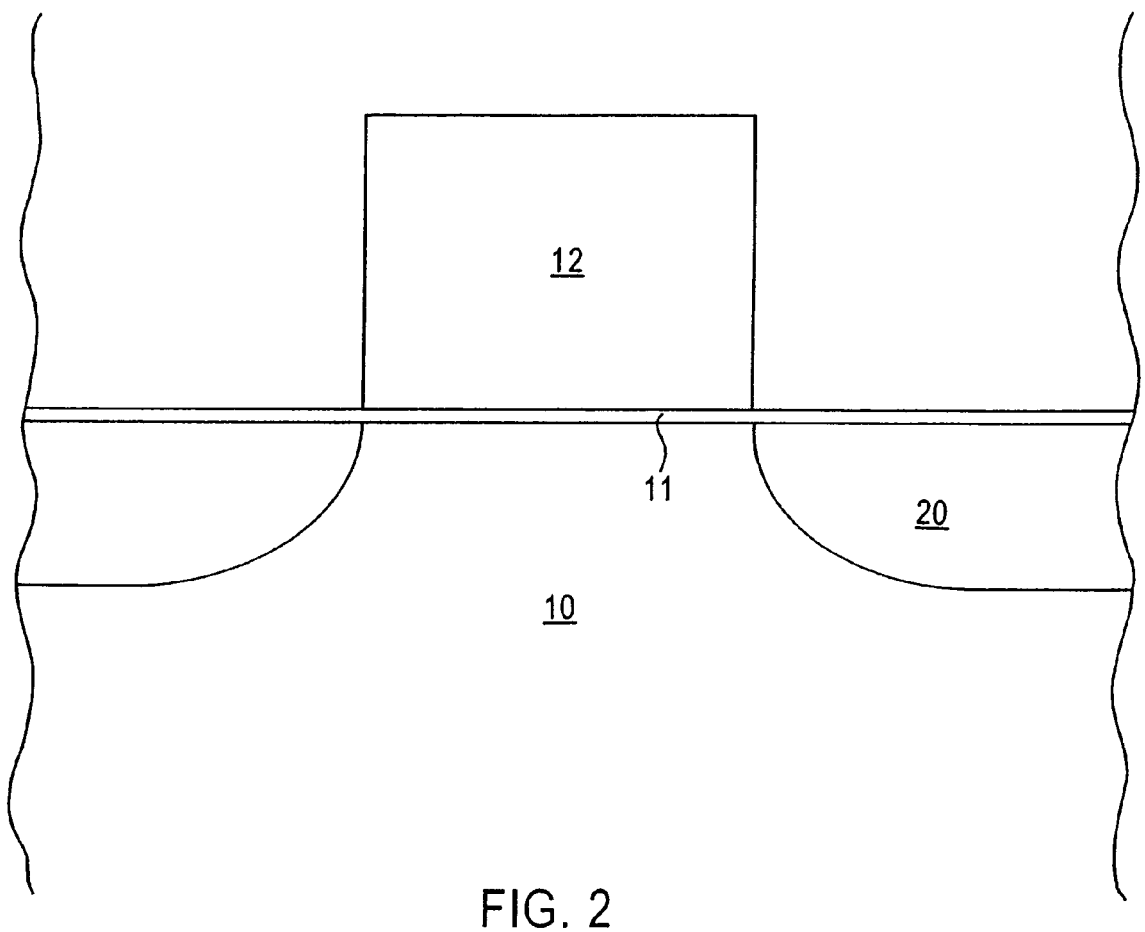

Adverting to FIG. 2, ion implantation is then conducted, using gate precursor 12 having the height H1 greater than 1,000 Å, followed by rapid thermal annealing to form deep source/drain regions 20. The height H1 of gate electrode precursor 12 is sufficient to prevent impurity ions from penetrating therethrough into gate oxide layer 11.

Figure 3:
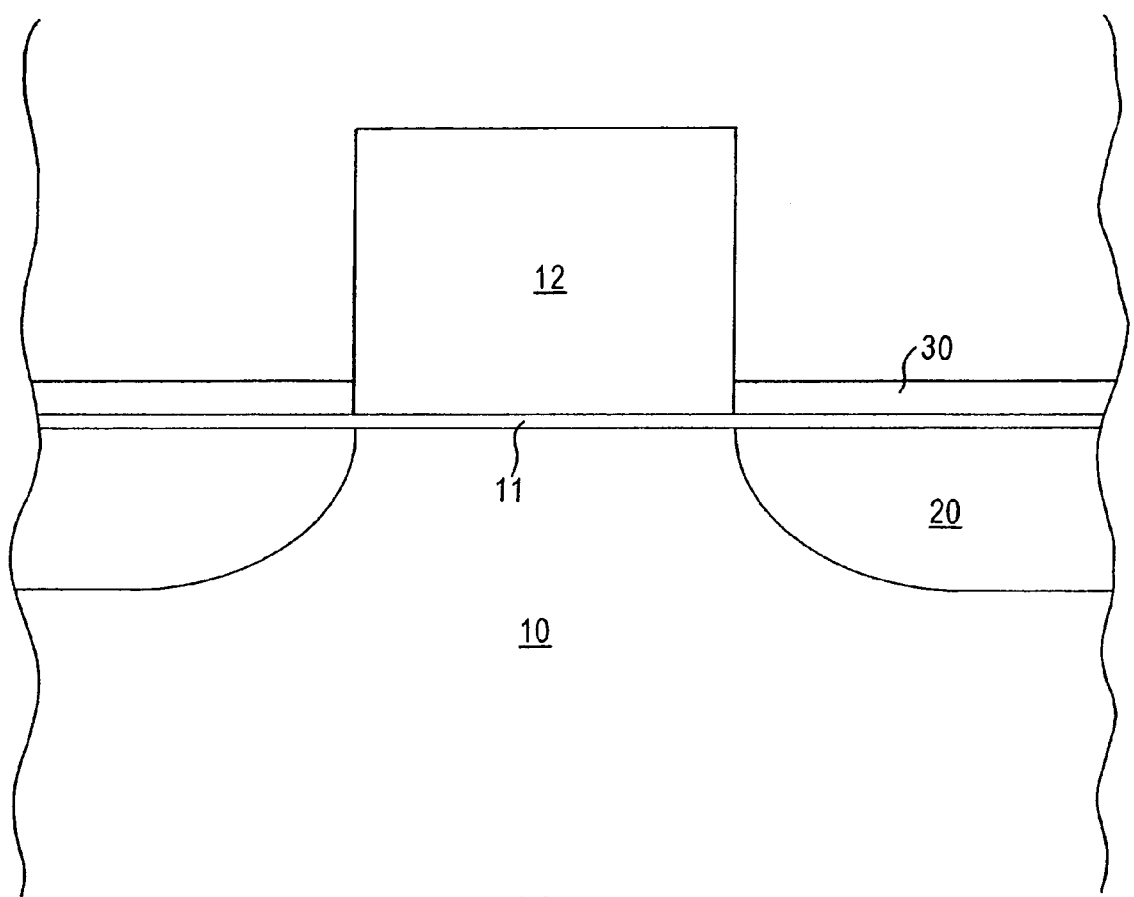

Adverting to FIG. 3, a protective dielectric layer 30 is then formed on the main surface of semiconductor substrate 10 overlying deep source/drain regions 20 on opposite sides of polysilicon gate precursor 12. Layer 30 can comprise silicon nitride deposited by chemical vapor deposition at a thickness of 50 Å to 300 Å.

Figure 4:
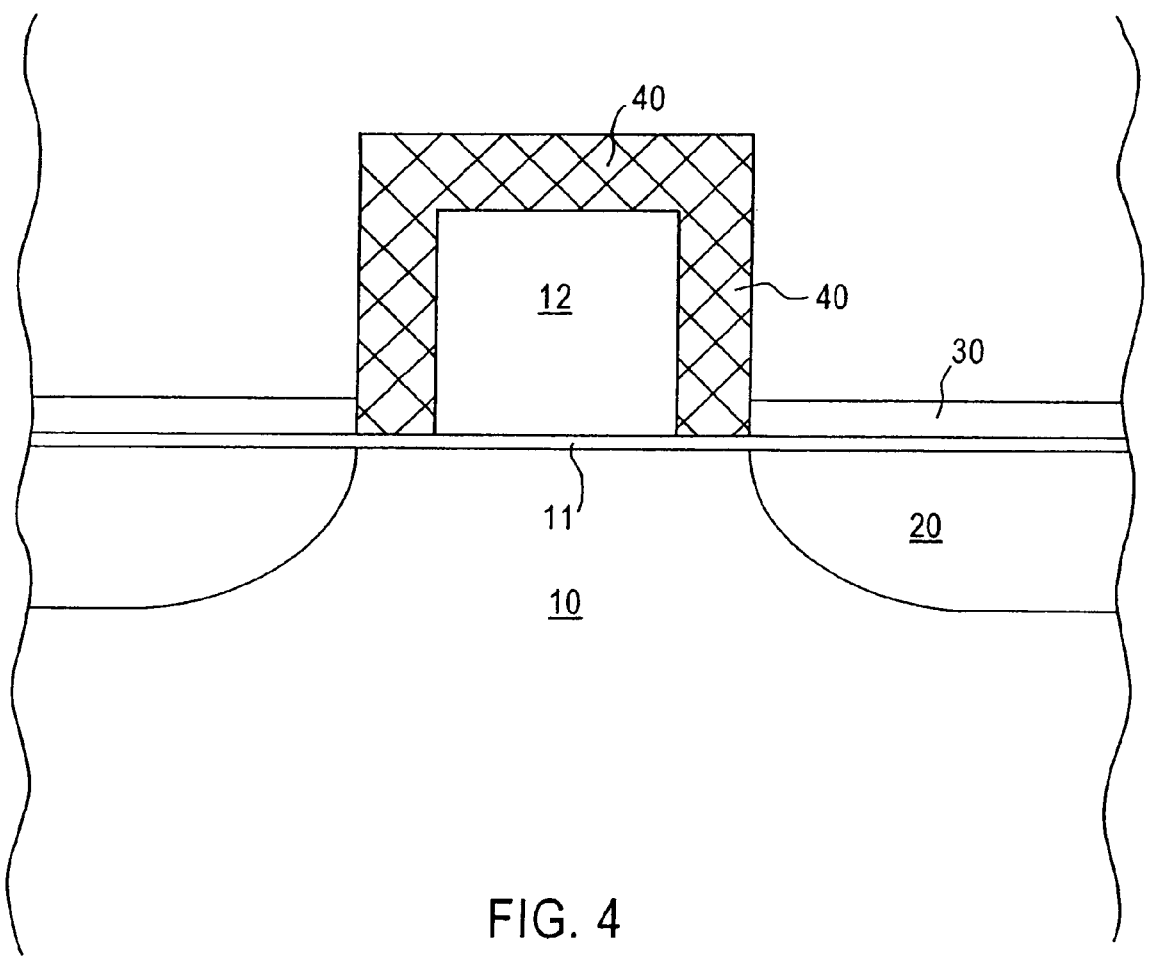

Subsequently, as shown in FIG. 4, oxidation is implemented, as by heating in an oxidizing atmosphere to oxidize the side surfaces of polysilicon gate electrode precursor 12 forming oxidized surfaces 40 thereon, as at a thickness of 100 Å to 700 Å. The selectively oxidized surfaces 40 consume silicon from the polysilicon gate etched precursor 12 thereby reducing its lateral and vertical dimensions.

Figure 5:
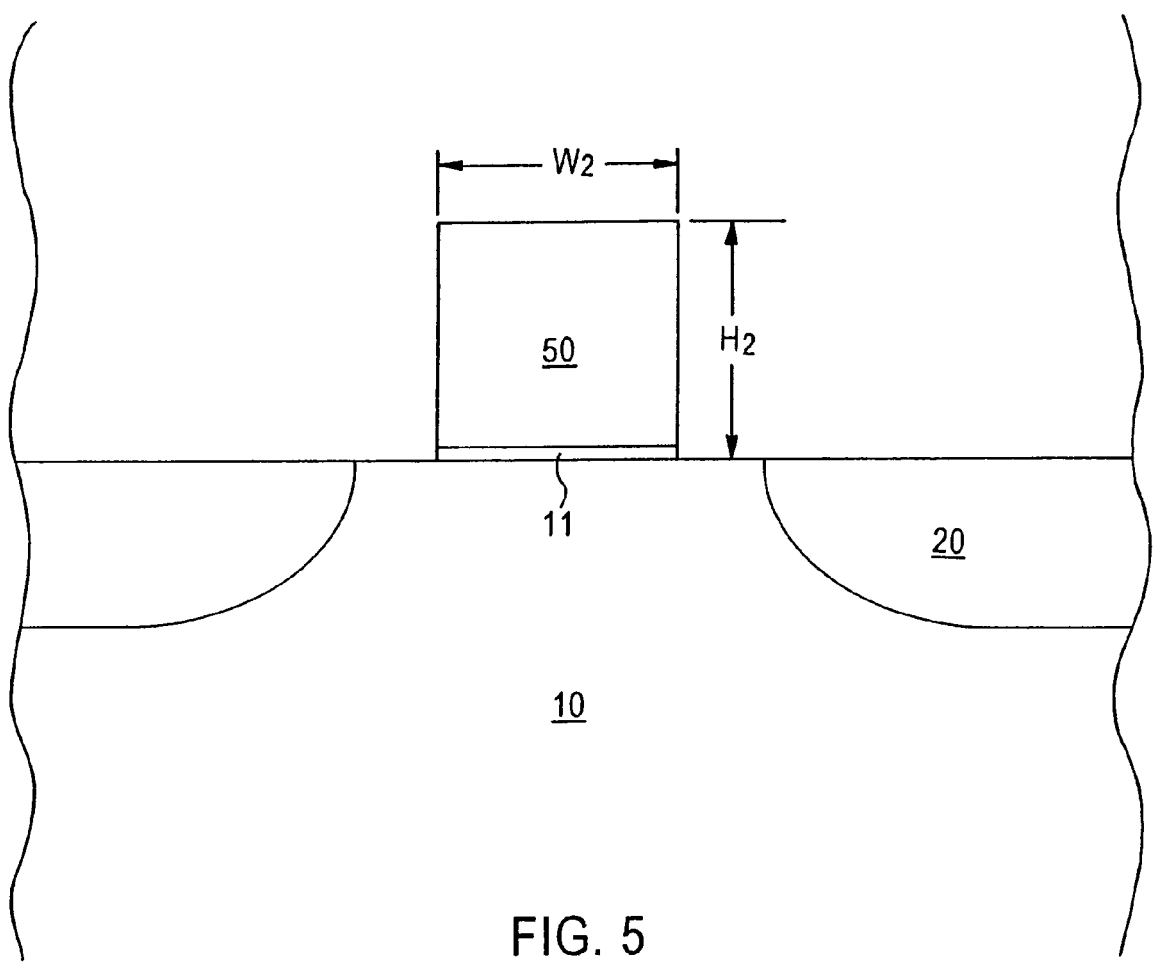

As shown in FIG. 5, the oxidized surfaces 40 are removed, as are nitride layers 30 and the extension of the gate oxide layer 11. The resulting intermediate structure, as shown in FIG. 5, comprises gate electrode 50 having a reduced height H2 less than 1,000 Å, such as 300 Å to 1,000 Å, and a reduced width W2 less than 500 Å, such as 100 Å to 500 Å. Removal of the oxidized layers 40 and 11 can be implemented in a conventional manner using selective etchants, such as a buffered hydrofluoric acid solution. Removal of the nitride layer 30 can be implemented in a conventional manner, as with boiling phosphoric acid.

Figure 6:
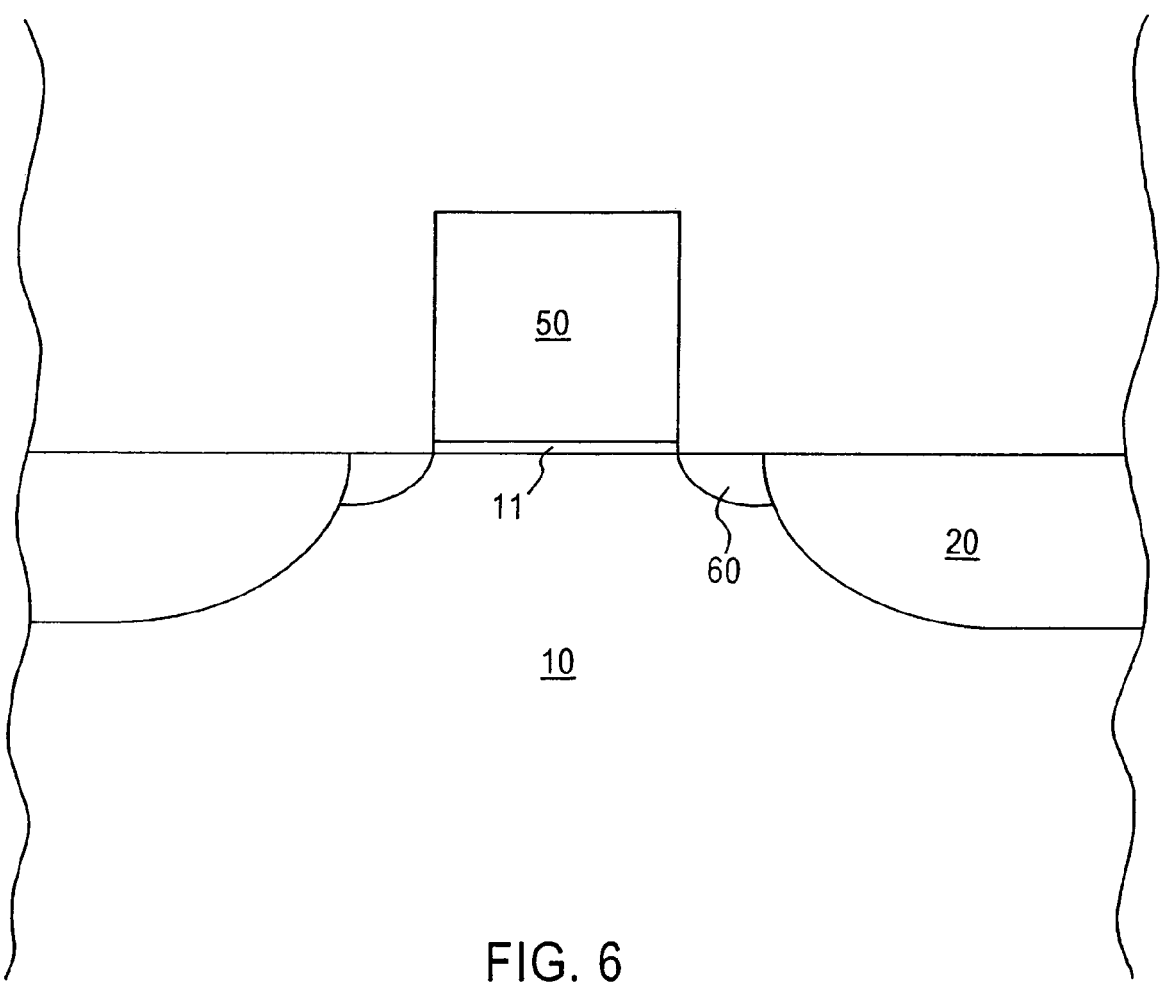
Figure 7:
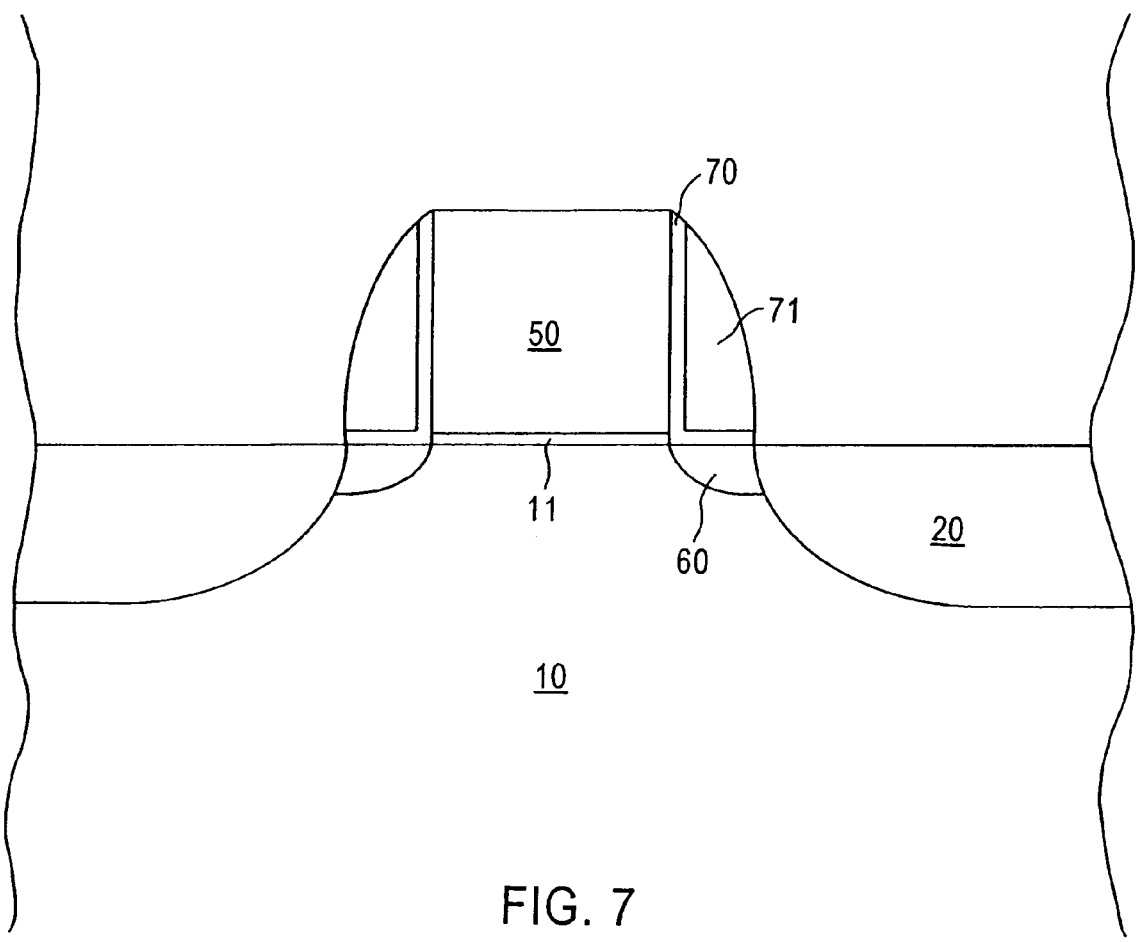
Figure 8:
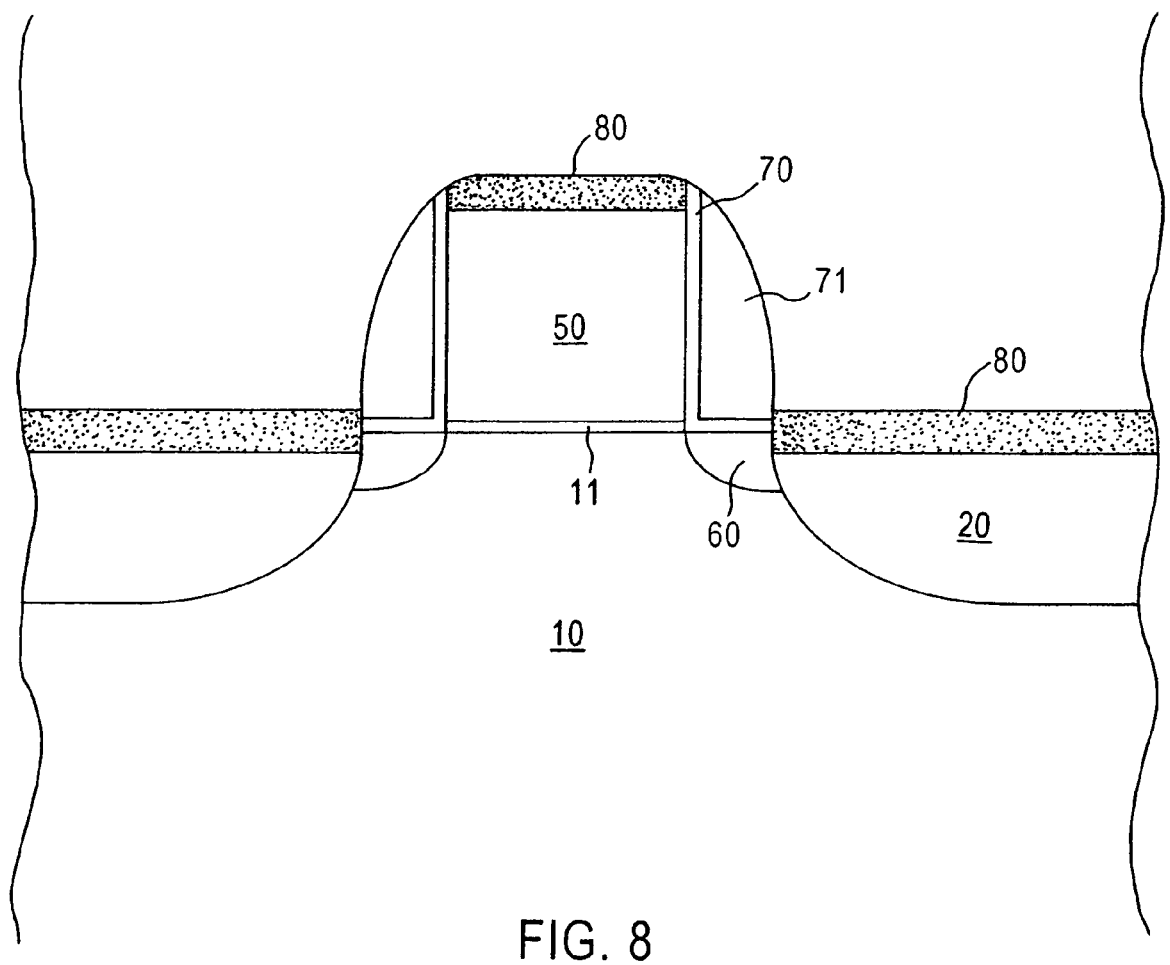

Subsequently, as shown if FIG. 6, ion implantation is conducted, using miniaturized gate electrode 50 as a mask, to form shallow source/drain extension 60. A silicon oxide or nitride liner 70, as shown in FIG. 7, may be formed on the side surfaces of the gate electrode 50 and on a portion of the upper surface of semiconductor substrate 10, as by chemical vapor deposition, or silicon oxide may be grown, as at a thickness of 20 Å to 200 Å. Silicon nitride/oxide sidewall spacers 71 are then formed, as by chemical vapor deposition at a thickness of 850 Å to 900 Å, on silicon oxide/nitride liner 70. The silicon oxide/nitride liner 70 on top of polysilicon is etched off when the silicon nitride/oxide spacer 71 is etched. Subsequently, as illustrated in FIG. 8, the silicidation is conducted in a conventional manner, as by depositing a layer of metal, such as nickel, cobalt or tungsten, and then heating to react the deposited metal with the underlying silicon to form metal silicide layers 80 on the upper surface of gate electrode 50 and on the main surface of the semiconductor substrate 10 over deep source/drain regions 20, resulting in the device illustrated in FIG. 8.

The present invention provides efficient methodology enabling the fabrication of miniaturized gate electrodes without pushing the limitations of conventional photolithographic techniques and without adversely impacting gate dielectric integrity. Advantageously, methodology in accordance with the present invention enables a reduction in not only the gate width but also the gate height, thereby avoiding disadvantages attendant upon a high aspect ratio. As the deep source/drain regions are prior to reducing the height of the gate electrode, gate oxide integrity issues are avoided, and device performance associated with deeper implants for good contacts is retained. The reduction in gate height also advantageously reduces fringing capacitance between the gate electrode and associated source/drain regions.

The present invention enjoys industrial applicability in manufacturing any of various types of semiconductor devices. The present invention is particularly applicable in manufacturing semiconductor devices with high operating speeds having design features in the deep sub-micron regime.

In the preceding detailed description, the present invention is described with reference to specifically exemplary embodiments thereof. It will, however, be evident that various modifications and changes may be made thereto without departing from the broader spirit and scope of the present invention, as set forth in claims. The specification and drawings are, accordingly, to be regarded as illustrative and not as restrictive. It is understood that the present invention is capable of using various other combinations, and environments and is capable of changes or modifications within the scope of the inventive concept as expressed herein.

What is claimed is:

1. A method of manufacturing a semiconductor device, the method comprising:

forming a polysilicon gate electrode precursor, having first side surfaces at a first width and an first upper surface at a first height, over a main surface of a semiconductor substrate with a gate insulating layer therebetween;

forming nitride layers on the main surface of the semiconductor substrate on each side of the polysilicon gate electrode precursor;

selectively oxidizing the first side surfaces and the upper surface of the polysilicon gate electrode precursor to form oxidized layers thereon; and removing the oxidized layers from the polysilicon gate electrode precursor to form a polysilicon gate electrode having second side surfaces at a second width less than the first width and a second upper surface at a second height less than the first height.

2. The method according to claim 1, comprising:
forming an oxide layer on the main surface of the semiconductor substrate;
forming a layer of polysilicon on the oxide layers;
patterning to form the polysilicon gate electrode precursor with a gate oxide layer thereunder and extending on the main surface of the semiconductor substrate; and
forming the nitride layers on the gate oxide layer extending on the main surface of the semiconductor substrate.

3. The method according to claim 1, comprising:
ion implanting impurities, using the polysilicon gate electrode precursor as a mask, to form deep source/drain regions;
forming the nitride layers on the main surface of the semiconductor substrate over the deep source/drain regions;
selectively oxidizing the side surfaces and upper surfaces of the polysilicon gate electrode precursor to form the oxidized layers thereon;
removing the oxide layers from the silicon gate electrode precursor to form the polysilicon gate electrode;
removing the nitride layers; and
ion implanting impurities using the polysilicon gate electrode as a mask, to form source/drain extensions.

4. The method according to claim 3, further comprising:
forming dielectric sidewall spacers on side surfaces of the polysilicon gate electrode; and
forming metal silicide layers on the upper surface of the polysilicon gate electrode and on the main surface of the semiconductor substrate over the deep source/drain regions.

5. The method according to claim 4, comprising forming silicon nitride sidewall spacers as the sidewall spacers on the side surfaces of the polysilicon gate electrode.

6. The method according to claim 5, comprising:
forming an oxide liner on the second side surfaces of the polysilicon gate electrode and on a portion of the main surface of the semiconductor substrate; and
forming the silicon nitride sidewall spacers on the oxide liner.

7. The method according to claim 3, comprising forming the polysilicon gate electrode at a second height less than 1,000 Å and at a second width less than 500 Å.

8. The method according to claim 7, comprising forming the polysilicon gate electrode precursor at a first height greater than 1,000 Å and at a first width greater than 500 Å.

9. The method according to claim 8, comprising forming the polysilicon gate electrode at a second height of 300 Å to 900 Å and at a second width of 150 Å to 400 Å.

10. The method according to claim 7, further comprising:
forming silicon nitride sidewall spacers on the second side surfaces of the polysilicon gate electrode; and
forming metal silicide layers on the second upper surface of the polysilicon gate electrode and on the main surface of the semiconductor substrate over the deep source/drain regions.

11. The method according to claim 10, comprising:
forming an oxide liner on the second side surfaces of the polysilicon gate electrode and on a portion of the main surface of the semiconductor substrate; and
forming the silicon nitride sidewall spacers on the oxide liner.

12. The method according to claim 1, comprising forming the polysilicon gate electrode at a second height less than 1,000 Å and at a second width less than 500 Å.

13. The method according to claim 12, comprising forming the polysilicon gate electrode precursor at a first height greater than 1,000 Å and at a first width greater than 500 Å.

14. The method according to claim 13, comprising forming the polysilicon gate electrode at a second height of 300 Å to 900 Å and at a second width of 150 Å to 400 Å.

* * * * *